US009502256B2

(12) United States Patent
Ahn et al.

(10) Patent No.: US 9,502,256 B2
(45) Date of Patent: *Nov. 22, 2016

(54) ZRAlON FILMS (71) Applicant: Micron Technology, Inc., Boise, ID (US)

(72) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/990,214

(22) Filed: Jan. 7, 2016

(65) Prior Publication Data
US 2016/0118259 A1 Apr. 28, 2016

Related U.S. Application Data (60) Continuation of application No. 14/664,572, filed on Mar. 20, 2015, now Pat. No. 9,236,245, which is a division of application No. 12/790,598, filed on May 28, 2010, now Pat. No. 8,993,455, which is a division of application No. 11/498,578, filed on Aug. 3, 2006, now Pat. No. 7,727,905.

(51) Int. Cl.
H01L 21/31 (2006.01)
H01L 21/28 (2006.01)
C23C 16/30 (2006.01)
C23C 16/455 (2006.01)
(Continued)

(52) U.S. Cl.
CPC ....... *H01L 21/28158* (2013.01); *C23C 16/308* (2013.01); *C23C 16/45531* (2013.01); *C23C 16/45546* (2013.01); *H01L 21/0228* (2013.01); *H01L 21/02178* (2013.01); *H01L 21/02189* (2013.01); *H01L 21/3143* (2013.01); *H01L 28/40* (2013.01)

(58) Field of Classification Search
None
See application file for complete search history.

(56) References Cited

U.S. PATENT DOCUMENTS 5,510,173 A * 4/1996 Pass ............... C23C 14/086
359/360
6,383,873 B1 5/2002 Hegde et al.
(Continued)

FOREIGN PATENT DOCUMENTS

WO WO-0197257 A2 12/2001

OTHER PUBLICATIONS

"International Technology Roadmap for Semiconductors, 2001 Edition", Organized by International SEMATECH, [Online]. Retrieved from the Internet: <URL: http://public.itrs.net/Files/2001ITRS/Home.html>, (2001), 469 pages.
(Continued)

Primary Examiner — Reema Patel
(74) Attorney, Agent, or Firm — Schwegman Lundberg & Woessner, P.A.

(57) ABSTRACT

Atomic layer deposition (ALD) can be used to form a dielectric layer of zirconium aluminum oxynitride (ZrAlON) for use in a variety of electronic devices. Forming the dielectric layer may include depositing zirconium oxide using atomic layer deposition and precursor chemicals, followed by depositing aluminum nitride using precursor chemicals, and repeating. The dielectric layer may be used as the gate insulator of a MOSFET, a capacitor dielectric, and a tunnel gate insulator in flash memories.

18 Claims, 4 Drawing Sheets (51) Int. Cl.
*H01L 21/314* (2006.01)
*H01L 21/02* (2006.01)
*H01L 49/02* (2006.01)

(56) References Cited

U.S. PATENT DOCUMENTS

| | | | |
|---|---|---|---|
| 6,407,435 B1 | 6/2002 | Ma et al. |
| 6,495,436 B2 | 12/2002 | Ahn et al. |
| 6,514,828 B2 | 2/2003 | Ahn et al. |
| 6,534,420 B2 | 3/2003 | Ahn et al. |
| 6,562,491 B1 | 5/2003 | Jeon |
| 6,617,639 B1 | 9/2003 | Wang et al. |
| 6,642,573 B1 | 11/2003 | Halliyal et al. |
| 6,660,660 B2 | 12/2003 | Haukka et al. |
| 6,664,154 B1 | 12/2003 | Bell et al. |
| 6,673,701 B1 | 1/2004 | Marsh et al. |
| 6,730,163 B2 | 5/2004 | Vaartstra |
| 6,730,164 B2 | 5/2004 | Vaartstra et al. |
| 6,767,795 B2 | 7/2004 | Ahn et al. |
| 6,784,049 B2 | 8/2004 | Vaartstra |
| 6,794,284 B2 | 9/2004 | Vaartstra |
| 6,800,497 B2 | 10/2004 | Wang et al. |
| 6,806,211 B2 | 10/2004 | Shinriki et al. |
| 6,844,203 B2 | 1/2005 | Ahn et al. |
| 6,844,604 B2 | 1/2005 | Lee et al. |
| 6,863,725 B2 | 3/2005 | Vaartstra et al. |
| 6,893,984 B2 | 5/2005 | Ahn et al. |
| 6,900,122 B2 | 5/2005 | Ahn et al. |
| 6,916,398 B2 | 7/2005 | Chen et al. |
| 6,921,702 B2 | 7/2005 | Ahn et al. |
| 6,949,433 B1 | 9/2005 | Hidehiko et al. |
| 6,953,730 B2 | 10/2005 | Ahn et al. |
| 6,958,300 B2 | 10/2005 | Vaartstra et al. |
| 6,958,302 B2 | 10/2005 | Ahn et al. |
| 6,960,538 B2 | 11/2005 | Ahn et al. |
| 6,967,154 B2 | 11/2005 | Meng et al. |
| 6,967,159 B2 | 11/2005 | Vaartstra |
| 6,979,623 B2 | 12/2005 | Rotondaro et al. |
| 6,979,855 B2 | 12/2005 | Ahn et al. |
| 6,984,591 B1 | 1/2006 | Buchanan et al. |
| 6,984,592 B2 | 1/2006 | Vaartstra |
| 6,989,573 B2 | 1/2006 | Ahn et al. |
| 6,995,081 B2 | 2/2006 | Vaartstra |
| 7,026,694 B2 | 4/2006 | Ahn et al. |
| 7,030,042 B2 | 4/2006 | Vaartstra et al. |
| 7,037,862 B2 | 5/2006 | Ahn et al. |
| 7,041,609 B2 | 5/2006 | Vaartstra |
| 7,045,430 B2 | 5/2006 | Ahn et al. |
| 7,049,192 B2 | 5/2006 | Ahn et al. |
| 7,057,244 B2 | 6/2006 | Andreoni et al. |
| 7,068,544 B2 | 6/2006 | Forbes et al. |
| 7,077,902 B2 | 7/2006 | Vaartstra |
| 7,081,421 B2 | 7/2006 | Ahn et al. |
| 7,084,078 B2 | 8/2006 | Ahn et al. |
| 7,087,481 B2 | 8/2006 | Vaartstra et al. |
| 7,101,813 B2 | 9/2006 | Ahn et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,122,464 B2 | 10/2006 | Vaartstra |
| 7,125,815 B2 | 10/2006 | Vaartstra |
| 7,135,369 B2 | 11/2006 | Ahn et al. |
| 7,135,421 B2 | 11/2006 | Ahn et al. |
| 7,141,278 B2 | 11/2006 | Koh et al. |
| 7,154,118 B2 | 12/2006 | Lindert et al. |
| 7,160,577 B2 | 1/2007 | Ahn et al. |
| 7,183,186 B2 | 2/2007 | Ahn et al. |
| 7,195,999 B2 | 3/2007 | Forbes et al. |
| 7,196,007 B2 | 3/2007 | Vaartstra |
| 7,211,492 B2 | 5/2007 | Forbes et al. |
| 7,214,994 B2 | 5/2007 | Forbes et al. |
| 7,235,854 B2 | 6/2007 | Ahn et al. |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,279,732 B2 | 10/2007 | Meng et al. |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,368,402 B2 | 5/2008 | Vaartstra |
| 7,374,617 B2 | 5/2008 | Vaartstra |
| 7,410,918 B2 | 8/2008 | Vaartstra |
| 7,432,139 B2 | 10/2008 | Currie |
| 7,432,548 B2 | 10/2008 | Forbes et al. |
| 7,544,604 B2 | 6/2009 | Forbes et al. |
| 8,993,455 B2 | 3/2015 | Ahn et al. |
| 9,236,245 B2 * | 1/2016 | Ahn .................. C23C 16/308 |
| 2002/0089023 A1 | 7/2002 | Yu et al. |
| 2002/0115252 A1 | 8/2002 | Haukka et al. |
| 2002/0137330 A1 | 9/2002 | Ryan |
| 2002/0192974 A1 | 12/2002 | Ahn et al. |
| 2003/0040196 A1 | 2/2003 | Lim et al. |
| 2003/0043637 A1 | 3/2003 | Forbes et al. |
| 2003/0045078 A1 | 3/2003 | Ahn et al. |
| 2003/0176065 A1 | 9/2003 | Vaartstra |
| 2003/0200917 A1 | 10/2003 | Vaartstra |
| 2003/0207032 A1 | 11/2003 | Ahn et al. |
| 2003/0207504 A1 | 11/2003 | Fuselier et al. |
| 2003/0207540 A1 | 11/2003 | Ahn et al. |
| 2003/0213987 A1 | 11/2003 | Basceri |
| 2003/0227033 A1 | 12/2003 | Ahn et al. |
| 2003/0228747 A1 | 12/2003 | Ahn et al. |
| 2004/0009678 A1 | 1/2004 | Asai et al. |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0051134 A1 | 3/2004 | Jang et al. |
| 2004/0087178 A1 | 5/2004 | Koyanagi et al. |
| 2004/0092073 A1 | 5/2004 | Cabral, Jr. et al. |
| 2004/0094801 A1 | 5/2004 | Liang et al. |
| 2004/0110391 A1 | 6/2004 | Ahn et al. |
| 2004/0126954 A1 | 7/2004 | Vaartstra et al. |
| 2004/0142546 A1 | 7/2004 | Kudo et al. |
| 2004/0144980 A1 | 7/2004 | Ahn et al. |
| 2004/0152254 A1 | 8/2004 | Vaartstra et al. |
| 2004/0175882 A1 | 9/2004 | Ahn et al. |
| 2004/0187968 A1 | 9/2004 | Vaartstra |
| 2004/0191997 A1 | 9/2004 | Kawahara et al. |
| 2004/0196688 A1 * | 10/2004 | Yamamoto ............. B82Y 10/00 365/154 |
| 2004/0197946 A1 | 10/2004 | Vaartstra et al. |
| 2004/0198069 A1 | 10/2004 | Metzner et al. |
| 2004/0214399 A1 | 10/2004 | Ahn et al. |
| 2004/0219746 A1 | 11/2004 | Vaartstra et al. |
| 2004/0262700 A1 | 12/2004 | Ahn et al. |
| 2005/0009266 A1 | 1/2005 | Vaartstra |
| 2005/0009368 A1 | 1/2005 | Vaartstra |
| 2005/0019978 A1 | 1/2005 | Vaartstra et al. |
| 2005/0020017 A1 | 1/2005 | Ahn et al. |
| 2005/0023594 A1 | 2/2005 | Ahn et al. |
| 2005/0023624 A1 | 2/2005 | Ahn et al. |
| 2005/0028733 A1 | 2/2005 | Vaartstra |
| 2005/0032360 A1 | 2/2005 | Vaartstra |
| 2005/0054165 A1 | 3/2005 | Ahn et al. |
| 2005/0077519 A1 | 4/2005 | Ahn et al. |
| 2005/0085092 A1 | 4/2005 | Adetutu et al. |
| 2005/0124171 A1 | 6/2005 | Vaartstra |
| 2005/0130442 A1 | 6/2005 | Visokay et al. |
| 2005/0136689 A9 | 6/2005 | Vaartstra |
| 2005/0142776 A1 | 6/2005 | Shin |
| 2005/0151184 A1 | 7/2005 | Lee et al. |
| 2005/0160981 A9 | 7/2005 | Vaartstra et al. |
| 2005/0173755 A1 | 8/2005 | Forbes |

(56) References Cited

U.S. PATENT DOCUMENTS

| | | |
|---|---|---|
| 2005/0218462 A1 | 10/2005 | Ahn et al. |
| 2005/0221006 A1 | 10/2005 | Vaartstra |
| 2005/0242391 A1 | 11/2005 | She et al. |
| 2005/0260347 A1 | 11/2005 | Narwankar et al. |
| 2005/0260357 A1 | 11/2005 | Olsen et al. |
| 2005/0271812 A1 | 12/2005 | Myo et al. |
| 2005/0271813 A1 | 12/2005 | Kher et al. |
| 2005/0282329 A1 | 12/2005 | Li |
| 2005/0285208 A1 | 12/2005 | Ren et al. |
| 2005/0285225 A1 | 12/2005 | Ahn et al. |
| 2005/0285226 A1 | 12/2005 | Lee |
| 2005/0287804 A1 | 12/2005 | Vaaartstra |
| 2005/0287819 A1 | 12/2005 | Vaartstra et al. |
| 2006/0019033 A1 | 1/2006 | Muthukrishnan et al. |
| 2006/0024975 A1 | 2/2006 | Ahn et al. |
| 2006/0043504 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0062917 A1 | 3/2006 | Muthukrishnan et al. |
| 2006/0086993 A1 | 4/2006 | Suzuki et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0151823 A1 | 7/2006 | Govindarajan |
| 2006/0163676 A1* | 7/2006 | Shimizu ............ H01L 21/28194 257/410 |
| 2006/0166476 A1 | 7/2006 | Lee et al. |
| 2006/0172485 A1 | 8/2006 | Vaartstra |
| 2006/0176645 A1 | 8/2006 | Ahn et al. |
| 2006/0177975 A1 | 8/2006 | Ahn et al. |
| 2006/0183272 A1 | 8/2006 | Ahn et al. |
| 2006/0186458 A1 | 8/2006 | Forbes et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0231017 A1 | 10/2006 | Vaartstra |
| 2006/0244082 A1 | 11/2006 | Ahn et al. |
| 2006/0244100 A1 | 11/2006 | Ahn et al. |
| 2006/0252244 A1 | 11/2006 | Vaartstra et al. |
| 2006/0252279 A1 | 11/2006 | Vaartstra |
| 2006/0258175 A1 | 11/2006 | Vaartstra et al. |
| 2006/0261389 A1 | 11/2006 | Vaartstra |
| 2006/0264066 A1 | 11/2006 | Bartholomew et al. |
| 2006/0270147 A1 | 11/2006 | Ahn et al. |
| 2006/0281330 A1 | 12/2006 | Ahn et al. |
| 2006/0284220 A1 | 12/2006 | Watanabe et al. |
| 2006/0286747 A1* | 12/2006 | Mouli .................. B82Y 10/00 438/257 |
| 2006/0292788 A1 | 12/2006 | Vaartstra |
| 2007/0006798 A1 | 1/2007 | Vaartstra et al. |
| 2007/0007560 A1 | 1/2007 | Forbes et al. |
| 2007/0045676 A1 | 3/2007 | Forbes et al. |
| 2007/0045752 A1 | 3/2007 | Forbes et al. |
| 2007/0144438 A1 | 6/2007 | Vaartstra |
| 2007/0155190 A1 | 7/2007 | Vaartstra et al. |
| 2007/0161260 A1 | 7/2007 | Vaartstra |
| 2007/0166999 A1 | 7/2007 | Vaartstra |
| 2007/0234949 A1 | 10/2007 | Ahn et al. |
| 2007/0295273 A1 | 12/2007 | Vaartstra |
| 2008/0054330 A1 | 3/2008 | Forbes et al. |
| 2008/0057659 A1 | 3/2008 | Forbes |
| 2008/0064210 A1 | 3/2008 | Vaartstra |
| 2008/0102629 A1 | 5/2008 | Vaartstra |
| 2008/0121962 A1 | 5/2008 | Forbes et al. |
| 2008/0124907 A1 | 5/2008 | Forbes et al. |
| 2008/0124908 A1 | 5/2008 | Forbes et al. |
| 2015/0194299 A1 | 7/2015 | Ahn et al. |

OTHER PUBLICATIONS

"Tantalum Lanthanide Oxynitride Films", U.S. Appl. No. 11/514,545, filed Aug. 31, 2006.

Ahn, et al., "ALD of Zr-Substituted BaTiO3 Films as Gate Dielectrics", U.S. Appl. No. 11/498,559, filed Aug. 3, 2006 Client Ref No. 06-0094.

Ahn, K Y, "ALD of Silicon Films on Germanium", U.S. Appl. No. 11/498,576, filed Aug. 3, 2006.

Ahn, K Y, "Atomic Layer Deposited Barium Strontium Titanium Oxide Films", U.S. Appl. No. 11/510,803, filed Aug. 26, 2006.

Ahn, K Y, "Atomic Layer Deposited Titanium-Doped Indium Oxide Films", U.S. Appl. No. 11/400,836, filed Apr. 7, 2006.

Ahn, K Y, "Deposition of ZrAlON Films", U.S. Appl. No. 11/498,578, filed Aug. 3, 2006.

Ahn, Kie Y, "ALD of Amorphous Lanthanide Doped TIOX Films", U.S. Appl. No. 11/092,072, filed Mar. 29, 2005, 04-1321.

Ahn, Kie Y, "Atomic Layer Deposited Hafnium Tantalum Oxide Dielectrics", U.S. Appl. No. 11/029,757, filed Jan. 5, 2005.

Ahn, Kie Y, "Atomic Layer Deposited Lanthanum Aluminum Oxide Dielectric Layer", U.S. Appl. No. 10/930,167, filed Aug. 31, 2004, 04-0686.

Ahn, Kie Y, "Atomic Layer Deposited Lanthanum Hafnium Oxide Dielectrics". U.S. Appl. No. 11/010.529, filed Dec. 13, 2004.

Ahn, Kie Y, "Atomic Layer Deposited Titanium Aluminum Oxide Films", U.S. Appl. No. 10/931,533, filed Aug. 31, 2004, client ref No. 04-0579.

Ahn, Kie Y, "Atomic Layer Deposited Titanium Silicon Oxide Films", U.S. Appl. No. 11/093,104, filed Mar. 29, 2005, 05-0019.

Ahn, Kie Y, "Atomic Layer Deposited Zirconium Silicon Oxide Films", U.S. Appl. No. 11/117,121, filed Apr. 28, 2005, 05-0061.

Ahn, Kie Y, "Atomic Layer Deposition of a Ruthenium Layer to a Lanthanide Oxide Dielectric Layer", U.S. Appl. No. 11/117,125, filed Apr. 28, 2005, 05-1116.

Ahn, Kie Y, "Atomic Layer Deposition of CEO2/AL2O3 Films as Gate Dielectrics", U.S. Appl. No. 11/055,380, filed Feb. 10, 2005, 04-1094.

Ahn, Kie Y, "Atomic Layer Deposition of DY-Doped HFO2 Films as Gate Dielectrics", U.S. Appl. No. 11/053,577, filed Feb. 8, 2005, 04-1179.

Ahn, Kie Y, "Atomic Layer Deposition of Hf3N4/HfO2 Films as Gate Dielectrics", U.S. Appl. No. 11/063,717, filed Feb. 23, 2005, 04-1248.

Ahn, Kie Y, "Atomic Layer Deposition of Zr3N4/ZrO2 Films as Gate Dielectrics", U.S. Appl. No. 11/058,563, filed Feb. 15, 2005.

Ahn, Kie Y, "Atomic Layer Deposition of ZRX HFY SN1-X-Y O2 Films as High K Gate Dielectrics", U.S. Appl. No. 11/215,530, filed Aug. 29, 2005, 05-0311.

Ahn, Kie Y, "Cobalt Titanium Oxide Dielectric Films", U.S. Appl. No. 11/216,958, filed Aug. 31, 2005, 05-0523.

Ahn, Kie Y, "Conductive Layers for Hafnium Silicon Oxynitride Films", U.S. Appl. No. 11/355,490, filed Feb. 16, 2006, (Client Ref. No. 05-0987).

Ahn, Kie Y, "Gallium Lanthanide Oxide Films", U.S. Appl. No. 11/329,025, filed Jan. 10, 2006.

Ahn, Kie Y, et al., "Hafnium Lanthanide Oxynitride Films", U.S. Appl. No. 11/515,143, filed Aug. 31, 2006.

Ahn, Kie Y, "Hafnium Tantalum Titanium Oxide Films", U.S. Appl. No. 11/297,741, filed Dec. 8, 2005, 05-0782.

Ahn, Kie Y, "Hafnium Titanium Oxide Films", U.S. Appl. No. 11/140,643, filed May 27, 2005, 05-0172.

Ahn, Kie Y, "Hybrid ALD-CVD of PrXOY/ZrO2 Films as Gate Dielectrics", U.S. Appl. No. 11/010,766, filed Dec. 13, 2004, 04-0997.

Ahn, Kie Y, "Iridium / Zirconium Oxide Structure", U.S. Appl. No. 11/152,759, filed Jun. 14, 2005, 05-0201.

Ahn, Kie Y, et al., "Lanthanide Yttrium Aluminum Oxide Dielectric Films", U.S. Appl. No. 11/297,567, filed Dec. 8, 2005, 05-0711.

Ahn, Kie Y, "Lanthanum Aluminum Oxynitride Dielectric Films", U.S. Appl. No. 11/216,474, filed Aug. 31, 2005, 05-0565.

Ahn, Kie Y, et al., "Magnesium Tetanium Oxide Films", U.S. Appl. No. 11/189,075, filed Jul. 25, 2005, 05-0381.

Ahn, Kie Y, "Ruthenium Gate for a Lanthanide Oxide Dielectric Layer", U.S. Appl. No. 10/926,812, filed Aug. 26, 2004, client ref No. 04-0538.

Ahn, Kie Y, "Zirconium-Doped Gadolinium Oxide Films", U.S. Appl. No. 11/215,578, filed Aug. 29, 2005, 05-0597.

(56) References Cited

OTHER PUBLICATIONS

Chin, Albert, et al., "Device and reliability of high-K Al O gate dielectric. with good mobility and low D", 1999 Symposium on VLSI Technology Digest of Technical Papers, (1999), 135-136.

Cho, H., et al., "Novel nitrogen profile engineering for improved TaN/HfO2/Si MOSFET performance", International Electron Devices Meeting, 2001. IEDM Technical Digest., (2001), 655-658.

Degrave, R, "Temperature Acceleration of oxide breakdown and its impact on ultra-thin gate oxide reliaility", 1999 Symposium on VLSI Technology Digest of Technical Papers, (1999), 59-60.

Endo, Kazuhiko, "Metal Organic Atomic Layer Deposition of High-k Gate Dielectrics Using Plasma Oxidation", Japanese Journal of Applied Physics, 42, (2003), L685-L687.

Forbes, et al., "Metal Substituted Transistor Gates", U.S. Appl. No. 11/176,738, filed Jul. 7, 2005.

Forbes, et al., "Metal-Substituted Transistor Gates", U.S. Appl. No. 11/445,000 mailed Jun. 1, 2006.

Forbes, Leonard, "Non-Volatile Memory Device With Tensile Strained Silicon Layer", U.S. Appl. No. 11/260,339, filed Oct. 27, 2005 (Client Ref. No. 05-0753), 26 pages.

Horwitz, J S, et al., "Pulsed laser deposition as a materials research tool", Applied Surface Science, 127-29, (May, 1998), 507-513.

Ishii, Hiroyuki, "Growth and electrical properties of atomic-layer deposited ZrO2/Si-nitride stack gate dielectrics", Journal of Applied Physics, 95(2), (Jan. 15, 2004), 536-542.

Jeon, T. S., "Thermal Stabilitiy of ultrathin ZrO2 films prpared by chemical vapor deposition of Si(100)", Appl. Phys. Lett., 78(3), (Jan. 15, 2001), 368-370.

Jeong, Chang-Wook, "Plasma-Assisted Atomic Layer Growth of High-Quality Aluminum Oxide Thin Films", Japanese Journal of Applied Physics, Part 1: Regular Papers and Short Notes and Review Papers, 40(1), (Jan. 2001), 285-289.

Jonsson, A. K., "Dielectric Permittivity and Intercalation Parameters of Li Ion Intercalated Atomic Layer Deposited ZrO2," Journal of the Electrochemical Society, vol. 151, No. 3, (2004), F54-F58.

Kim, C. T, et al., "Application of Al2O3 Grown by Atomic Layer Deposition to DRAM and FeRAM", International Symposium in Integrated Ferroelectrics, (Mar. 2000), 316.

Kim, Y., et al., "Substrate dependence on the optical properties of Al/sub 2/O/sub 3/ films grown by atomic layer deposition", Applied Physics Letters, 71(25 ), (Dec. 22, 1997), 3604-3606.

Kukli, Kaupo, "Low-Temperature Deposition of Zirconium Oxide-Based Nanocrystalline Films by Alternate Supply of Zr[OC(CH3)3]4 and H2O", Chemical Vapor Deposition, 6(6), (2000), 297-302.

Leskela, M., "ALD precursor chemistry: Evolution and future challenges", J. Phys. IV France, 9, (1999), 837-852.

Muller, D. A., et al., "The electronic structure at the atomic scale of ultrathin gate oxides", Nature, 399, (Jun. 24, 1999), 758-61.

Nalwa, H. S, "Handbook of Thin Film Materials", Deposition and Processing of Thin Films, vol. 1, San Diego : Academic Press, (2002), 114-119.

Nam, Seok-Woo, "Study of ZrO2 thin films for gate oxide applications", Journal of Vacuum Science & Technology A: Vacuum, Surfaces, and Films, 19(4), (Jul. 2001), 1720-1724.

Nieh, R. et al., "Evaluation of Silicon Surface Nitridation Effects on Ultra-thin ZrO2 GateDielectrics", Applied Physics Letters, 81(9), (Aug. 26, 2002), 1663-1665.

Packan, Paul A, "Pushing the Limits", Science, 285(5436), (Sep. 1999), 2079-2081.

Ritala, et al., "Handbook of Thin Film Materials", replacement reference to be entered Mar. 31, 2009 jld, (2002), 103-108.

Robertson, John, "Band offsets of wide-band-gap oxides and implications for future electronic devices", Journal of Vacuum Science & Technology B: Microelectronics and Nanometer Structures, 18(3), (May 2000), 1785-1791.

Shin, Chang Ho, "Fabrication and Characterization of MFISFET Using Al2O3 Insulating Layer for Non-volatile Memory", 12th International Symposium in Integrated Ferroelectrics, (Mar. 2000), 9 pages.

Sneh, Ofer, et al., "Thin film atomic layer deposition equipment for semiconductor processing", Thin Solid Films, 402(1-2), (2002), 248-261.

Suntola, Tuomo, "Atomic layer epitaxy", Thin Solid Films, 216(1), (Aug. 28, 1992), 84-89.

Suntola, Tuomo, "Chapter 14—Atomic Layer Epitaxy", In: Handbook of Crystal Growth, 3; Thin Films of Epitaxy, Part B: Growth Mechanisms and Dynamics, Elsevier Science B.V., Amsterdam, The Netherlands, (1994), 601-663.

Wilk, G. D., "High-K gate dielectrics: Current status and materials properties considerations". Journal of Applied Physics, 89(10), (May 2001), 5243-5275.

Youm, Minsoo, "Metal oxide semiconductor field effect transistor characteristics with iridium gate electrode on atomic layer deposited ZrO2 high-k dielectrics", Jpn. J. Appl. Phys., vol. 42, (Aug. 2003), 5010-5013.

Yu, Xiongfei, et al., "Advanced MOSFETs using HfTaON/SiO/sub 2/ gate dielectric and TaN metal gate with excellent performances for low standby power application", IEEE International Electron Devices Meeting, 2005. IEDM Technical Digest., (Dec. 2005), 27-30.

Zhu, J, et al., "Pulsed laser deposited ZrAlON films for high-k gate dielectric applications", Applied Physics A, 81, (Nov. 2005), 1167-1171.

Zhu, J, "Structure and dielectric properties of ultra-thin ZrO2 films for high-k gate dielectric application prepared by pulsed laser deposition", Applied Physics A Materials Science & Processing, 78, (5), (2004), 741-744.

Zhu, J, et al., "Structure and dielectric properties of Zr Al O thin films prpared by pulsed laser deposition", Microelectronic Engineering, 66, (2003), 849-854.

\* cited by examiner

ZRAION FILMS

RELATED APPLICATION

This application is a continuation of U.S. application Ser. No. 14/664,572, filed Mar. 20, 2015, now issued as U.S. Pat. No. 9,236,245, which is a divisional of U.S. application Ser. No. 12/790,598, filed May 28, 2010, now issued as U.S. Pat. No. 8,993,455, which is a divisional of U.S. application Ser. No. 11/498,578, filed Aug. 3, 2006, now issued as U.S. Pat. No. 7,727,908, all of which are incorporated herein by reference in their entirety.

TECHNICAL FIELD

This application relates generally to semiconductor devices and device fabrication, including dielectric layers and their method of fabrication.

BACKGROUND

The semiconductor industry has a constant market-driven competitive requirement to reduce the size of electronic devices, such as transistors and capacitors, and to increase the operational speed of the device as well as reduce the device power consumption. To reduce transistor size, the thickness of the gate dielectric (typically silicon dioxide, $SiO_2$) is reduced in proportion to the reduction in the gate length. For example, a metal-oxide-semiconductor field effect transistor (MOSFET) would use a 1.5 nm (i.e., 15 Å) thick $SiO_2$ gate dielectric for a gate channel length of less than 100 nm (i.e., 0.1μ). This scaling of gate dielectric thickness may be the most difficult issue facing the production of new generations of MOSFETs. Increasingly small, faster, lower power consumption and more reliable integrated circuits (ICs) will likely be used in manufacturing products such as processor chips, mobile telephones, and memory devices such as dynamic random access memories (DRAMs).

A thermally grown amorphous $SiO_2$ layer provides a good electrically and thermodynamically stable material, where the interface of the $SiO_2$ layer with underlying silicon provides a high quality interface as well as superior electrical isolation properties. However, continued scaling in microelectronic devices may develop reliability and leakage issues as the gate dielectric becomes thinner, such as increased leakage currents passing through the thinner gate dielectric, and time dependent dielectric breakdown.

DETAILED DESCRIPTION

The scaling of the metal oxide semiconductor field effect transistors (MOSFETs) to submicron features sizes in order to increase operational speed, decrease power consumption, and increase reliability may be assisted by a corresponding reduction in the gate dielectric thickness. Although thermally grown amorphous silicon dioxide $SiO_2$ is often used in these applications, the thinner layers of silicon dioxide sometimes develop reliability and performance issues. As the silicon dioxide thickness is reduced to about 2.5 nm, gate leakage currents of one amp per square centimeter may flow through the dielectric due to direct tunneling. Such a problem may occur in many dielectric materials as the thickness approaches the tunneling thickness. Larger capacitance per unit area across the gate dielectric to control the electrical properties of the semiconductor material below the gate dielectric may be achieved, in some cases, by making the gate dielectric thinner. On the other hand, to obtain the desired capacitance per unit area without using leakage-prone dielectric layers, it may be beneficial to use physically thicker layers of dielectric materials that have higher dielectric constant (k) values than silicon dioxide. Thus, a physically thicker layer of a high dielectric constant material may electrically act like a much thinner layer of silicon dioxide, perhaps with reduced leakage and breakdown problems.

For example, it is sometimes possible to use thicker layers of zirconium aluminum oxide and oxynitrides to replace thinner silicon dioxide layers without changing the electrical properties of the transistor due to the higher dielectric constant. A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. The $t_{eq}$ may be defined as the thickness of a theoretical $SiO_2$ layer that has the same capacitance density as a given dielectric, ignoring leakage current and reliability considerations.

To continue the example, consider that silicon dioxide has a typical k value of 3.9, while a layer of zirconium aluminum oxynitride (ZrAlON) has a k value of around 18. Thus, a 4.5 nm layer of ZrAlON will have a $t_{eq}$ of about 1.0 nm of silicon dioxide. A transistor having a 45 Å gate dielectric thickness of zirconium aluminum oxynitride will behave approximately the same as a transistor having a 10 Å layer of silicon dioxide as the gate dielectric, but with fewer tunnel leakage and dielectric breakdown problems associated with thin dielectric layers.

A $SiO_2$ layer of thickness, t, deposited on a Si surface as a gate dielectric is expected to have a $t_{eq}$ larger than its physical thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness used for a $SiO_2$ layer in a gate dielectric should be approximately 4 to 7 Å.

Additional characteristics of a $SiO_2$ layer might depend on the gate electrode used in conjunction with the $SiO_2$ gate dielectric. Using a conventional polysilicon gate can result in an additional increase in $t_{eq}$ for the $SiO_2$ layer. This additional thickness might be eliminated by using a metal gate electrode, though metal gates are not as popular for use in typical complementary metal-oxide-semiconductor field effect transistor (CMOS) technology. Thus, future devices may have to be designed with a physical $SiO_2$ gate dielectric layer of about 5 Å or less.

Silicon dioxide is used as a gate dielectric, in part, due to its electrical isolation properties in a $SiO_2$—Si based structure. This electrical isolation is due to the relatively large band gap of $SiO_2$ (8.9 eV), resulting in a relatively good insulator. However, as the thickness of a $SiO_2$ layer decreases, the number of atomic layers, or monolayers of the material in the thickness typically decreases. At some level of reduced thickness, the number of monolayers may be so small that the $SiO_2$ layer will not have the complete arrangement of atoms found in a thicker, or bulk layer. As a result of incomplete formation relative to a bulk structure, a thin $SiO_2$ layer of only one or two monolayers may fail to form a full band gap. The lack of a full band gap in a $SiO_2$ gate dielectric may cause an effective short between an underlying conductive silicon channel and an overlying polysilicon gate. This undesirable property tends to limit the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ should be considered for use as a gate dielectric.

For a typical dielectric layer used as a gate dielectric, the capacitance may be determined as in a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material may be related to its $t_{eq}$ for a given capacitance, with $SiO_2$ having a dielectric constant $\kappa_{ox} = 3.9$, as $$t = (\kappa/\kappa_{ox})t_{eq} = (\kappa/3.9)t_{eq}.$$

Thus, materials with a dielectric constant greater than that of $SiO_2$ may have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

An equivalent oxide thickness for lower transistor operating voltages and smaller transistor dimensions may be realized by using materials that have higher dielectric constants than silicon dioxide. However, additional fabrication requirements can make determining a suitable replacement for $SiO_2$ difficult. Since the current view for the future of the microelectronics industry still predicts silicon based devices, it is useful to consider the deposition or growth of gate dielectrics on a silicon substrate or silicon layer. During the formation of the dielectric on the silicon layer, there exists the possibility that a thin layer of $SiO_2$ could be formed in addition to the desired dielectric. The result may comprise a dielectric layer having two sub-layers connected with each other, and the silicon layer on which the dielectric is formed. In such a case, the resulting capacitance may be determined as that of two dielectrics in series. Thus, the $t_{eq}$ of the dielectric layer may be considered as the sum of the $SiO_2$ thickness and a multiplicative factor of the thickness t of the dielectric being formed, written as $$t_{eq} = t_{SiO_2} + (\kappa_{ox}/\kappa)t.$$

Thus, if a $SiO_2$ layer is formed in the deposition process, the $t_{eq}$ may again be limited by a $SiO_2$ layer. In the event that a barrier layer is formed between the silicon layer and the desired dielectric in which the barrier layer prevents the formation of a $SiO_2$ layer, the $t_{eq}$ may be limited by the layer with the lowest dielectric constant. However, whether a single dielectric layer with a high dielectric constant or a barrier layer with a higher dielectric constant than $SiO_2$ is employed, the layer directly in contact, or interfacing with the silicon layer should provide a high quality interface to maintain high channel carrier mobility.

One of the advantages of using $SiO_2$ as a gate dielectric has been that the formation of the $SiO_2$ layer results in an amorphous gate dielectric. Amorphous gate dielectrics can provide reduced leakage current problems associated with grain boundaries in polycrystalline gate dielectrics. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ may have the disadvantage of a crystalline form, either as deposited, or after heat cycling.

Some of the best candidates for replacing $SiO_2$ as a gate dielectric are those with high dielectric constant, which can be fabricated as a thin layer with an amorphous form. These include high k dielectric materials that also have a large energy gap ($E_g$) and large energy barrier heights with the silicon substrate for both electrons and holes. Generally, the band gap may be inversely related to the dielectric constant, which lessens some advantages of high k materials. Candidate materials include various lanthanide silicates, hafnium oxide ($HfO_2$), aluminum oxide ($AlO_3$), zirconium oxide ($ZrO_2$) and zirconium nitride $Zr_3N_4$ and combinations of these materials, such as zirconium aluminum oxynitride ($ZrAlO_XN_Y$). Such high dielectric constant layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness can reduce leakage current, in particular the leakage current caused by tunneling mechanisms.

The use of high dielectric constant materials for gate dielectrics in electronic devices therefore has the potential to improve leakage and breakdown over the use of very thin silicon dioxide layers. How to provide the high dielectric constant material for the gate dielectric is the next issue, and a discussion of the basics of atomic layer deposition (ALD) will provide an understanding of how this deposition method may be used in this situation.

ALD, which may also be known as atomic layer epitaxy (ALE), is a modification of the well known deposition method chemical vapor deposition (CVD) and may also be called "alternatively pulsed-CVD". In ALD, precursor chemicals are typically introduced one at a time to the substrate surface mounted within a reaction chamber (or reactor). The precursors may be gas, liquid or solid, and may be evaporated, sublimed, boiled, bubbled or entrained into a gaseous flow for introduction into the vacuum reaction chamber. This introduction of the precursors takes the form of pulses of each precursor. In a pulse, the precursor is made to flow into a specific area or region for a short period of time. Between pulses the reaction chamber is purged with a gas, which may be an inert gas, and/or evacuated.

In the first reaction step of the ALD process the first precursor saturates and may be chemisorbed (or adsorbed) at the substrate surface, during the first pulsing phase. Subsequent pulsing with a purging gas removes excess precursor from the reaction chamber, usually that portion of the precursor that has not been chemisorbed onto the substrate surface.

The second pulsing phase may introduce a second precursor chemical to the substrate where the growth reaction of the desired film takes place, with a thickness depending upon the amount of the chemisorbed first precursor. Subsequent to the film growth reaction, reaction byproducts and precursor excess may be purged from the reaction chamber. With a precursor chemistry where the precursors adsorb and react with each other on the substrate aggressively, one ALD cycle can be performed in a few seconds in properly designed flow type reaction chambers. Typically, precursor pulse times are about 0.5 sec to 3 seconds.

In ALD processes, the saturation of all the reaction and purging phases makes the film growth self-limiting. This self-limiting growth results in large area uniformity and conformality, which has important applications for such cases as planar substrates, deep trenches, and in the processing of porous silicon and high surface area silica and alumina powders. ALD can operate to control film thickness in a straightforward manner by controlling the number of growth cycles.

The precursors used in an ALD process may be gaseous, liquid or solid. However, liquid or solid precursors may be volatile with high vapor pressures or low sublimation temperatures. The vapor pressure should be high enough for effective mass transportation. In addition, solid precursors, and some liquid precursors may work better when heated inside the reaction chamber and introduced through heated tubes to the substrates. The necessary vapor pressure should be reached at a temperature below the substrate temperature to avoid condensation of precursors on the substrate. Due to the self-limiting growth mechanisms of ALD, relatively low vapor pressure solid precursors may be used, though evaporation rates may vary somewhat during the process because of changes in their surface area.

There are several other characteristics which may be present for precursors used in ALD. The precursors should be thermally stable at the substrate temperature because their decomposition can destroy the surface control and accordingly the advantages of the ALD method that uses the reaction of the precursor at the substrate surface. A slight decomposition, if slow compared to the ALD growth, may be tolerated.

The precursors should chemisorb on, or react with the surface, though the interaction between the precursor and the surface as well as the mechanism for the adsorption can be different for different precursors. The molecules at the substrate surface should react aggressively with the second precursor, which may be called a reactant, to form the desired solid film. Additionally, precursors should not react with the film to cause etching, and precursors should not dissolve in the film. The use of highly reactive precursors in ALD may contrast with the precursors for conventional metallo-organic CVD (MOCVD) type reactions. The by-products in the reaction should be gaseous in order to allow their easy removal from the reaction chamber during a purge stage. Further, it may be useful if the by-products do not react or adsorb on the surface.

In a reaction sequence ALD process, the self-limiting process sequence may involve sequential surface chemical reactions, such as the chemistry between a reactive surface and a reactive molecular precursor. In many ALD processes, molecular precursors can be pulsed into the ALD reaction chamber separately. The precursor reaction at the substrate is typically followed by an inert gas pulse (or purge) to remove excess precursor and by-products from the reaction chamber prior to an input pulse of the next precursor of the fabrication sequence.

By the use of ALD processes, films can be layered in substantially equal metered sequences that are all substantially the same with respect to chemical kinetics, deposition thickness per cycle, and composition. ALD sequences generally deposit less than a full layer of the deposited material (for example zirconium oxide) per deposition cycle. Typically, a deposition or growth rate of about 0.25 to about 2.00 Å per ALD cycle can be realized.

The advantages of ALD include continuity at an interface avoiding poorly defined nucleating regions that are typical for thin chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and the ability to engineer multilayer laminate films with a resolution of one to two monolayers. ALD processes sometimes permit deposition control on the order of single monolayers and the ability to deposit monolayers of amorphous films.

A cycle of an ALD deposition sequence can include pulsing a precursor material, pulsing a purging gas for the precursor, pulsing a reactant precursor, and pulsing the reactant's purging gas, resulting in a deposition thickness that is a function of the amount of the first precursor that adsorbs onto, and saturates, the surface. This cycle may be repeated until the desired thickness is achieved in a single material dielectric layer, or may be alternated with pulsing a third precursor material, pulsing a purging gas for the third precursor, pulsing a fourth reactant precursor, and pulsing the fourth reactant's purging gas.

In the case where the thickness of the first series of cycles results in a dielectric layer that is only a few molecular layers thick, and the second series of cycles also results in a different dielectric layer that is only a few molecular layers thick, this may be known as a nanolayer material or a nanolaminate. A nanolaminate means a composite film of ultra thin layers of two or more different materials in a layered stack, where the layers are alternating layers of the different materials having a thickness on the order of a nanometer, and may be a continuous film only a single monolayer thick of the material. The nanolayers are not limited to alternating single layers of each material, but may include having several layers of one material alternating with a single layer of the other material, to obtain a desired ratio of the two or more materials. Such an arrangement may obtain a dielectric constant that is between the values of the two or more materials singly. The different materials may remain separate after deposition, or they may react with each other to form an alloy layer.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate dielectric may increase by a factor of 10 for every 0.1 increase in the root-mean-square (RMS) roughness of the dielectric layer.

During a conventional sputtering deposition process, particles of the material to be deposited may bombard the surface at a high energy. When a particle hits the surface, some particles may adhere, and other particles may cause damage. High energy impacts can remove body region particles, creating pits. The surface of such a deposited layer may have a rough contour due to the rough interface at the body region. ALD depositions, on the other hand, may have high conformality, being smooth on smooth substrates.

Figure 1:
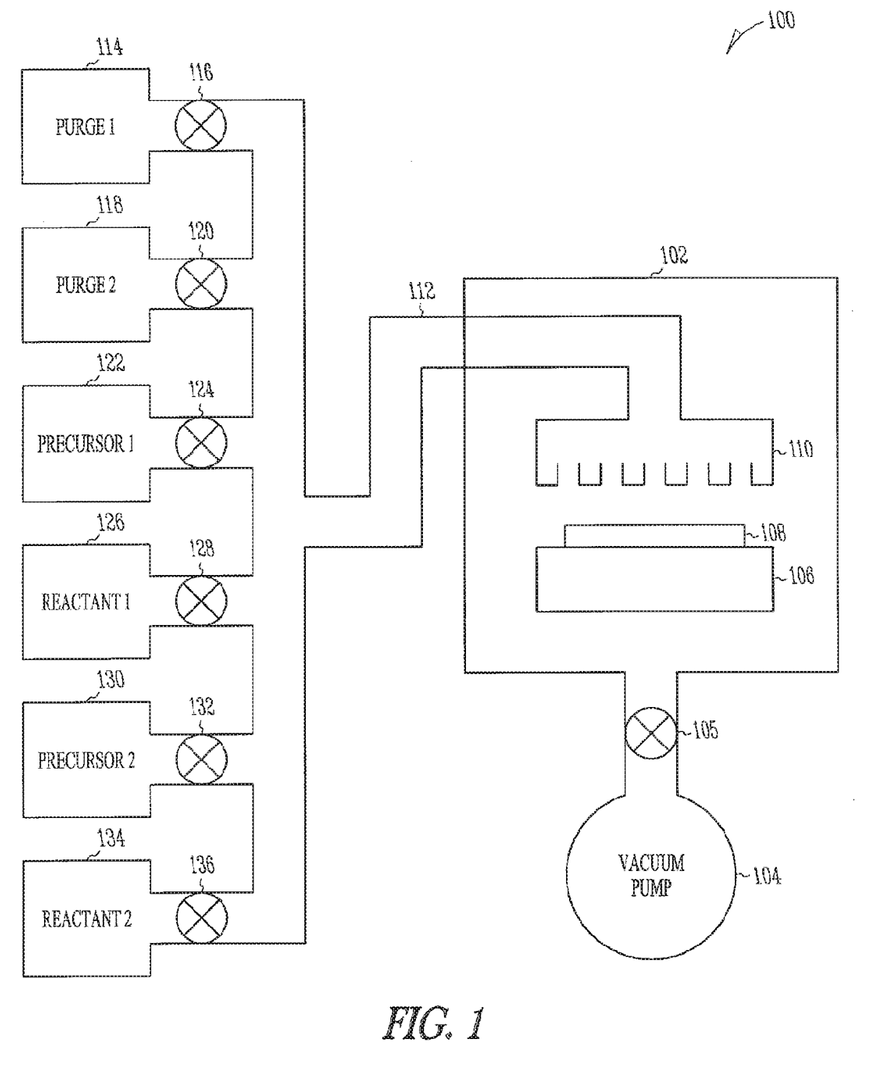
FIG. 1 depicts an atomic layer deposition system for fabricating a dielectric layer, according to various embodiments.

FIG. 1 shows various embodiments of an ALD system 100 for forming a dielectric film containing zirconium nitride and zirconium oxide. In FIG. 1, a substrate 108 on a heating element/wafer holder 106 may be located inside a reaction chamber 102 of ALD system 100. The heating element 106 may be thermally coupled to substrate 108 to control the substrate temperature. A gas-distribution fixture 110 can introduce precursor, reactant and purge gases to the substrate 108 in a uniform fashion. The gases introduced by the gas distribution fixture 110, sometimes referred to as a showerhead, may react with the substrate 108, and excess gases and reaction products may be removed from chamber 102 by a vacuum pump 104 through a control valve 105. Each gas may originate from individual gas sources 114, 118, 122, 126, 130, and 134, with a flow rate and time controlled by mass-flow controllers 116, 120, 124, 128, 132 and 136, respectively. Gas sources 122 and 130 may provide a precursor gas either by storing the precursor as a gas or by evaporating a solid or liquid material to form the selected precursor gas.

Also included in the system 100 may be purging gas sources 114 and 118, coupled to mass-flow controllers 116 and 120, respectively. One or more of the purge gases may be used in the disclosed illustrative purging steps, substantially simultaneously, or alternately, or in some other combination, as desired for the particular desired result. Furthermore, additional purging gas sources can be constructed in the ALD system 100, including one purging gas source for each different precursor and reactant gas, for example. For a process that uses the same purging gas for multiple precursor gases, fewer purging gas sources may be used. The precursor, reactant and purge gas sources may be coupled by their associated mass-flow controllers to a common gas line or conduit 112, which is coupled to the gas-distribution fixture 110 inside the reaction chamber 102. Gas conduit 112 may also be coupled to another vacuum pump, or exhaust pump, not shown, to remove excess precursor gases, purging gases, and by-product gases at the end of a purging sequence from the gas conduit 112.

The vacuum pump, or exhaust pump, 104 may be coupled to the chamber 102 by a control valve 105, which may comprise a mass-flow valve, to remove excess precursor gases, purging gases, and by-product gases from reaction chamber 102 at the end of a purging sequence. For convenience, control displays, mounting apparatus, temperature sensing devices, substrate maneuvering apparatus, and electrical connections known to those skilled in the art are not shown in FIG. 1. Though the ALD system 100 shown in FIG. 1 is well suited for depositing $ZrO_2$ and $Zr_3N_4$ films, other commercially available ALD systems may also be used.

The use, construction and operation of reaction chambers for deposition of films are understood by those of ordinary skill in the art of semiconductor fabrication. A variety of such commercially available reaction chambers may be used. Furthermore, one of ordinary skill in the art will comprehend the detection, measurement, and control techniques used in the art of semiconductor fabrication that are not specifically disclosed herein, and those skilled in the art will also appreciate, after reviewing this disclosure, that the individual elements such as pressure control, temperature control, and gas flow within ALD system 100 can be under computer control.

The ALD system of FIG. 1 may be used to form electronic devices having a high dielectric constant, with a smooth surface and low surface roughness, a low interface state density, and an amorphous structure for gate dielectrics. In some embodiments, the dielectric may comprise zirconium aluminum oxynitride, which may be referred to as ZrAlON, though the proper formula is $Zr_A Al_B O_X N_Y$, where A plus B is typically equal to 2, A ranges from 0.5-1.5, B ranges from 0.5-1.5, and X plus Y is typically equal to 2, X ranges from 0.5-1.5, and Y ranges from 0.5-1.5.

In some embodiments, the ZrAlON dielectric layer may be deposited as a series of identical layers of ZrAlON, each layer deposited by a single cycle of ALD. In some embodiments, the ZrAlON dielectric may be deposited as interleaved layers of $Zr_3N_4$ and $Al_2O_3$, and the interleaved layers of $Zr_3N_4$ and $Al_2O_3$ may be annealed to form a single layer of ZrAlON. In some embodiments, the ZrAlON dielectric layer may be deposited as a series of interleaved layers of $ZrO_2$ and AN, and may be annealed to form a single layer of ZrAlON.

Zirconium nitride has a formula of $Zr_3N_4$ and a dielectric constant k of about 30. Zirconium nitride films can be atomic layer deposited using various homoleptic tetrakis (dialkylamino) metal (IV) complexes as precursors, such as $Zr[N(CH_3)(C_2H_5)]_4$, and ammonia $NH_3$ at 150° C. to 250° C. deposition temperature. Other known types of tetrakis (dialkylamino) metal (IV) compounds may also be used, such as tetrakis dimethlyamine, $Zr[N(CH_3)_2]_4$ or tetrakis diethylamine, $Zr[N(C_2H_5)_2]_4$. Zirconium nitride is a material having various stable formulae, including zirconium mononitride, which is shiny, gold colored, and highly electrically conductive, making it useful as an impurity diffusion barrier between the metallization conductor material and the semiconductor substrate. Another zirconium nitride, having a formula of $Zr_3N_4$, is a higher order nitride and has different properties from the mononitride, such as being transparent, electrically insulating, and having a high dielectric constant, making it useful as a gate insulator. $Zr_3N_4$ is also thermally stable and may be annealed at temperatures of up to 900° C.

Zirconium oxide has a formula of $ZrO_2$, a dielectric constant k of about 19 to 24, a high dielectric breakdown voltage of about 2 MeV, and a low leakage rate of about $1.1 \times 10^{-7}$ Å/cm$^2$ at a 1 MV/cm electric field strength. Zirconium oxide layers can be atomic layer deposited (ALD) using various precursors such as zirconium tetraiodide $ZrI_4$ and a mixture of steam and hydrogen peroxide at temperatures between 325 to 500° C., or zirconium tetrachloride $ZrCl_4$ and steam at 275 to 325° C. Zirconium oxide layers may also be deposited using homoleptic tetrakis (dialkylamino) metal(IV) or tetrakis dimethylamine $(Zr[N(CH_4)_2]_4)$ complexes and steam at deposition temperatures between 200 to 300° C. Water vapor mixed with hydrogen peroxide, oxygen gas, or ozone may also be used as the reactant material forming the zirconium oxide. In an embodiment the deposition temperature is between 275 to 325° C. Another precursor for zirconium ALD is zirconium tertiary-butoxide $(Zr(t-OC_4H_9)_4)$, or ZTB, which has a higher vapor pressure as compared to other liquid precursors, and is easier to use at room temperature in ALD processes.

Aluminum oxide has a formula of $Al_2O_3$, and while having a lower dielectric constant (around 10.0) than zirconium oxide (around 19-24), it does have a larger bandgap of 8.8-9.0 eV, and a large band gap offset, both of which help in reducing tunneling leakage current levels. Aluminum oxide also may remain amorphous at temperatures of up to 1000° C. and can provide a better oxygen barrier than zirconium compounds, which helps prevent oxidation of the silicon surface under the gate dielectric during subsequent thermal cycles, thus avoiding the formation of a native oxide and the two capacitors in series issue discussed previously. Aluminum oxide layers may be formed by ALD by use of trimethyl aluminum ($Al(CH_3)_3$) at a temperature range of 200-300° C. with water vapor as a reactant. Another aluminum precursor is alane ($AlH_3$), and dimethyl-ethylamine ($N(CH_3)_2(C_2H_5)$), known as DMEAA, which has a higher vapor pressure at room temperature and thus is easier to use in a vacuum system as a precursor. DMEAA may also have better long term stability and films formed using DMEAA can have less trapped carbon and chlorine.

A layer of ZrAlON dielectric may be grown by ALD using a mixed precursor of zirconium tertiary-butoxide ($Zr(t-OC_4H_9)_4$), which is known as ZTB, and trimethyl-aluminum ($Al(CH_3)_3$), which is know as TMA. The mixed precursor of ZTB and TMA may be introduced to the vacuum chamber at a substrate temperature of from 200 to 300° C., and a chamber wall temperature of 150° C. to prevent condensation, for a time of from 0.3 to 1.0 seconds. A purge of argon may be introduced for a time period of 5 seconds, followed by a reactant introduction of water vapor for a time period of from 0.5 to 1.0 seconds. The resulting single layer of ZrAlON may have a controlled thickness for each deposition cycle that is a function of the saturation of the substrate surface with the particular precursors chosen. If repetitive layers of ZrAlON are grown upon one another, then the resulting film may have a thickness that is more easily controlled by simply controlling the number of deposition cycles. The surface of the ALD layer formed may also be relatively smooth and continuous, even over sharp underlying topography.

One of the useful properties of ALD in forming dielectric layers is the high level of what is known as "step coverage", even over sharp edges and in trenches having aspect ratios of depth to width of 40 to 1. In some embodiments, the zirconium oxide layer has 100% step coverage over 90 degree angle steps.

A ZrAlON layer may also be formed by alternating between two different dielectrics, such as forming a layer of zirconium nitride as discussed above, followed by a layer of aluminum oxide, as described above, and repeating until the desired thickness is obtained. The resulting laminated film may be used as is, or may be annealed at a high temperature, for example by rapid thermal annealing (RTA), to form an essentially single ZrAlON layer having any desired content ratio between zirconium and aluminum, and between oxygen and nitrogen, to obtain the desired dielectric constant, work function, tunneling barrier asymmetry and oxidation barrier properties. Alternately, the ZrAlON layer may be formed from layers of zirconium oxide and aluminum nitride, and the resulting film may either comprise a nanolaminate of the two different dielectrics, or the two or more dielectrics may be annealed to form a single film. In either case the film properties may vary depending upon the ratio of the two or more different materials, and thus materials may be formed that have engineered properties. In some embodiments, the dielectric layer has a dielectric constant k value of about 19.

In some embodiments, a layer of ZrAlON may be formed on a substrate mounted in a reaction chamber using ALD. Alternately, multiple layers may be formed in a repetitive sequence using precursor gases individually pulsed into the reaction chamber. Some embodiments include forming zirconium nitride layers using a precursor gas such as zirconium tetrakisdimethylamine having a chemical formula of $Zr[N(CH_4)_2]_4$, and a reactant of ammonia $NH_3$ at deposition temperatures as low as 150 to 250° C. Some embodiments include forming the zirconium oxide layers using a zirconium tetraiodide $ZrI_4$, and a reactant of water vapor and hydrogen peroxide at a deposition temperature of between 325 to 500° C. Some embodiments include using zirconium tetrachloride $ZrCl_4$, and a reactant of steam at about 300° C. for the zirconium oxide. Other solid or liquid precursors, such as homoleptic (tetrakisdialkyloamido) metal (IV) complexes of zirconium including $Zr[(CH_3)_2]_4$, $Zr[(C_2H_5)_2]_4$, and $Zr[(CH_3)(C_2H_5)]_4$ may be used in appropriately designed reaction chambers. The use of such precursors in an ALD reaction chamber may result in lower deposition temperatures in the range of 150 to 350° C., and the ability to use mildly oxidizing reactant materials such as $H_2O$, $H_2O_2$, various alcohols, $N_2O$, $NH_3$, ozone or oxygen. Purge gases may include nitrogen, hydrogen, or inert gases such as helium, argon or neon. Such films may survive high temperature anneals (used to reduce fixed surface state charges and improve metal to semiconductor resistance) of up to 1000° C., and have leakage currents of less than $1.1 \times 10^{-7}$ $A/cm^2$ at electric field strengths of one MVolt/cm.

Figure 2:
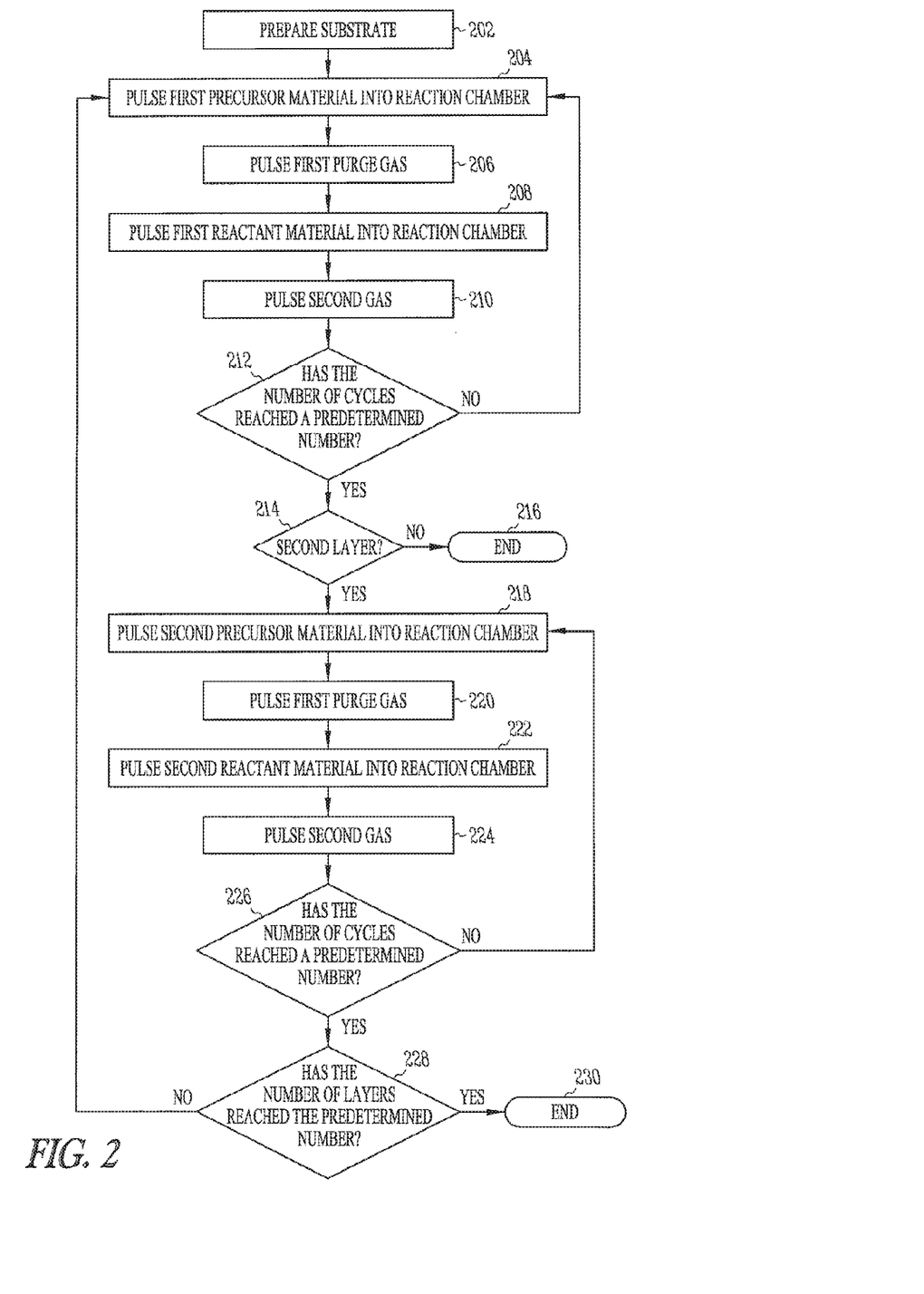
FIG. 2 illustrates a flow diagram of elements of a method to form a dielectric layer by atomic layer deposition, according to various embodiments.

FIG. 2 illustrates a flow diagram of operational steps for various embodiments of a method to form a ZrAlON layer by ALD. At block 202, a substrate may be prepared to react immediately with, and chemisorb the first precursor gas. This preparation may serve to remove contaminants such as thin organic films, dirt, and native oxide from the surface of the substrate, and may include a hydrofluoric acid rinse, or a sputter etch in the reaction chamber 102.

At block 204 a first precursor material may enter the reaction chamber for a predetermined length of time, for example 0.5-2.0 seconds. The first precursor material may be chemically adsorbed (chemisorbed) onto the surface of the substrate, the amount depending upon the temperature of the substrate, in one embodiment 250° C., and the presence of sufficient flow of the precursor material. In addition, the pulsing of the precursor may use a pulsing period that provides uniform coverage of a chemisorbed monolayer on the substrate surface, or may use a pulsing period that provides partial formation of a monolayer on the substrate surface.

At block 206 a first purge gas may enter the reaction chamber for a predetermined length of time, perhaps sufficient to remove substantially all of the non-chemisorbed first precursor material. Typical times may be 0.5-2.0 seconds with the purge gas comprising one or more of nitrogen, argon, neon and hydrogen.

At block 208 a first reactant gas may enter the chamber for a predetermined length of time, perhaps sufficient to provide enough of the reactant to chemically combine with substantially the entire amount of chemisorbed first precursor material on the surface of the substrate. Typical reactant materials include mildly oxidizing materials, including, but not limited to, water vapor, hydrogen peroxide, nitrogen oxides, ammonia, ozone and oxygen gas, and combinations thereof.

At block 210 a second purge gas, which may be the same as the first purge gas, may enter the chamber for a predetermined length of time, sufficient to remove substantially all non-reacted materials and reaction byproducts from the chamber.

At block 212 a decision may be made as to whether or not the thickness of the first dielectric material in the dielectric has reached the desired thickness, or whether another deposition cycle should be effected. If another deposition cycle of the first dielectric material is used, then the operation returns to 204, until the desired first dielectric layer is completed. If the initial layer of the first dielectric material is at or above the desired thickness, the process may move on to a decision as to whether a second dielectric material should be formed at block 214. In some embodiments, using a mixed precursor of ZTB and TMA as discussed above, the first dielectric layer may comprise ZrAlON, and no second dielectric layer is formed, since the final desired dielectric comprises multiple single ALD cycle layers of ZrAlON, each having a thickness of about 2 Å. In this case, the method may go directly to the end at block 216. If the first dielectric is zirconium nitride, then a second dielectric may be desired, and the method may proceed to block 218.

At block 218, the deposition of the second dielectric material may begin when a second precursor material enters the reaction chamber for a predetermined length of time, typically 0.3-2.0 seconds. The second precursor material may be chemically adsorbed onto the surface of the substrate, in this case being the top surface of the first dielectric material, with the amount of absorption depending upon the temperature of the substrate, and the presence of sufficient flow of the second precursor material. In addition, the precursor may use a pulsing period that provides substantially uniform coverage of an adsorbed monolayer on the substrate surface, or may use a pulsing period that provides partial formation of a monolayer on the substrate surface.

At block 220 the first purge gas may enter the chamber, but many embodiments are not so limited. The purge gas used in the second dielectric material deposition may be the same or different from either of the two previously noted purge gases, and FIG. 1 could be shown as having more than the two purge gases. The purge cycle may continue for a predetermined length of time sufficient to remove substantially all of the non-chemisorbed second precursor material.

At block 222 a second reactant gas, which may be the same or different from the first reactant gas shown at 208, may enter the chamber for a predetermined length of time, sufficient to provide enough of the reactant to chemically combine with substantially all the amount of chemisorbed second precursor material on the surface of the substrate. At block 224 another purge gas may enter the chamber, which may be the same or different from any of the three previously discussed purge gases, for a predetermined length of time, perhaps sufficient to remove substantially all non-reacted materials and reaction byproducts from the chamber.

At block 226 a decision is made as to whether or not the thickness of the second dielectric material in the (laminated) dielectric has reached the desired thickness, or whether another deposition cycle is desired. If another deposition cycle is used, then the method returns to block 218, until the desired initial second dielectric layer is completed. The desired thicknesses of the first and second dielectric materials in the dielectric may be the same, or different, and there may be more deposition cycles for one dielectric material as compared to the other. If the second dielectric layer has reached the desired thickness, the method may move on to a decision at block 228 as to whether the number of layers of the first and second dielectric materials have reached a desired number. In this illustrative embodiment, a single layer of the first dielectric (having a desired thickness), and a single layer of the second dielectric (having a desired thickness), have been completed at this point in the process.

If more than a single layer of each dielectric material is desired, the method can move back to another deposition of the first dielectric material at block 204, and the entire process can repeat itself. After the number of interleaved layers of dielectrics one and two has reached the desired value, the deposition method may end at block 230.

The embodiments described herein may provide a process for growing a dielectric film having a range of useful equivalent oxide thickness, $t_{eq}$, associated with a dielectric constant in the range from about 16 to about 19 (in some embodiments). For an acceptable equivalent silicon dioxide thickness, an embodiment using zirconium aluminum oxynitride (ZrAlON) may have a physical thickness that is more than four times larger than the equivalent silicon dioxide thickness, perhaps providing an enhanced probability of reducing leakage current, especially due to tunneling mechanisms. The aluminum oxide component may also reduce ZrAlON film oxygen permeability and parasitic silicon dioxide grown on the underlying silicon surface during subsequent heat cycles. The process may be implemented to form transistors, capacitors, memory devices, and other electronic structures and systems, including information handling devices.

Figure 3:
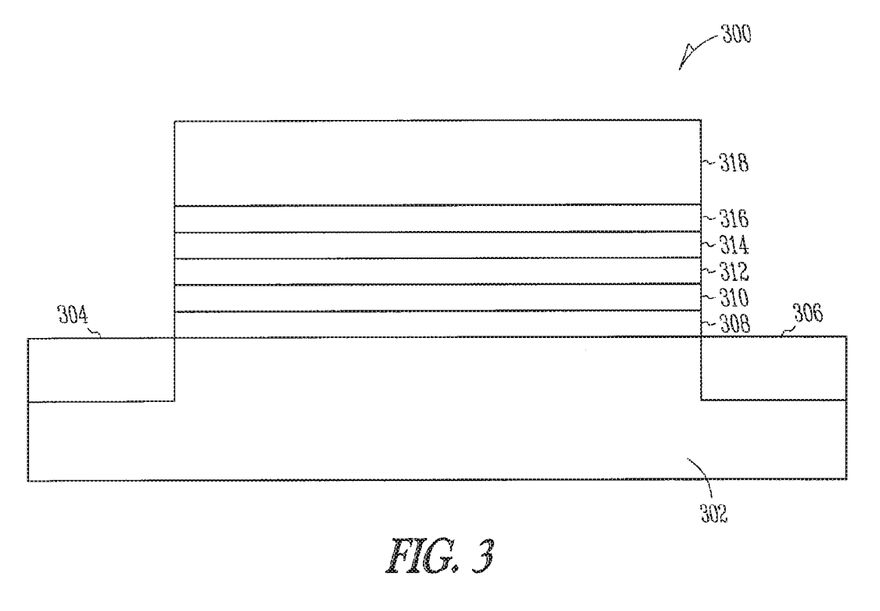
FIG. 3 illustrates a transistor having a dielectric layer containing an atomic layer deposited dielectric layer, according to various embodiments.

FIG. 3 illustrates various embodiments of a transistor and a dielectric layer containing an ALD deposited ZrAlON gate oxide dielectric layer. This embodiment may be implemented with the system 100 of FIG. 1 used as an ALD system. A substrate 302 is prepared, typically comprising silicon or a silicon-containing material. In other embodiments, germanium, gallium arsenide, silicon-on-sapphire substrates, or other suitable substrates 302 may also be used. The preparation process may include cleaning the substrate 302 and forming various layers and regions of the substrate, such as a drain diffusion 304 and a source diffusion 306 of an illustrative metal oxide semiconductor (MOS) transistor 300. The source and drain regions may be formed prior to forming a gate dielectric and gate electrode, or they may be formed after the gate electrode using a self-aligning process known to those of skill in the art. The substrate 302, which may comprise a silicon-based substrate, may be cleaned to provide an initial substrate depleted of its native oxide. The initial substrate 302 may be cleaned to provide a hydrogen-terminated surface. The substrate 302 may undergo a final hydrofluoric (HF) rinse prior to ALD processing to provide the substrate 302 with a hydrogen-terminated surface without a native silicon oxide layer. Cleaning immediately preceding ALD may aid in reducing an occurrence of silicon oxide as an interface between a silicon-based substrate and a dielectric formed using the ALD process. The sequencing of the formation of the regions of the transistor being processed may follow the generally understood fabrication of a MOS transistor, as is well known to those skilled in the art.

The dielectric covering the area on the substrate 302 between the source and drain diffused regions 304 and 306 may be deposited by ALD in this illustrative embodiment, and may comprise one or more ZrAlON dielectric layers 308, 310, 312, 314 and 316, to obtain the desired final gate dielectric thickness. Alternatively, the gate dielectric may be formed of interleaved and non-interleaved layers 308, 310, 312, 314, and 316 of varying thickness of aluminum oxide and zirconium nitride. A laminated dielectric layer is typically referred to as the gate oxide, and while shown as distinct and individual layers for clarity in FIG. 3, may comprise a single annealed layer. There may be a diffusion barrier layer inserted between the first dielectric layer 308 and the substrate 302 to prevent metal contamination from affecting the electrical properties of the device. The illustrative embodiment of FIG. 3 shows the various layers 308, 310, 312, 314, and 316 having the same thickness; however the desired dielectric properties of the overall dielectric film may be best achieved by adjusting the ratio of the thicknesses of the different dielectric layers to different values, as discussed above in an embodiment having two different materials. The transistor 300 may have a conductive material forming a gate 318, but the dielectric may also be used in a floating gate device such as an EEPROM (electrically-erasable programmable read-only memory) transistor, as either one or both of the floating gate and the control gate oxide layers. The conductive material may comprise polysilicon, various metals, refractory metals, metal nitrides, and metal silicides. The conductive material may be thermally treated or furnace annealed in a $H_2$ ambient after forming and patterning the metallization layer.

In an illustrative embodiment, the gate dielectric (comprising layers 308-316) may include a tunnel gate insulator and a floating gate dielectric in a flash memory device. Use of dielectric layers containing an atomic layer deposited dielectric layer for a gate dielectric and/or floating gate dielectric in which the dielectric layer contacts a conductive layer is not limited to silicon-based substrates, but may be used with a variety of semiconductor substrates.

Figure 4:
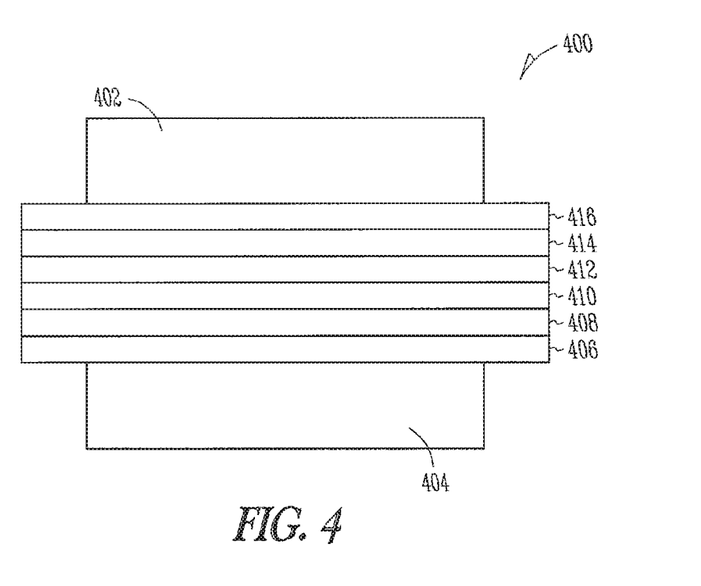
FIG. 4 shows a capacitor having a dielectric layer containing an atomic layer deposited dielectric layer, according to various embodiments.

The embodiments of methods for forming dielectric layers containing an ALD deposited dielectric layer contacting a conductive layer may also be applied to forming capacitors in various integrated circuits, memory devices, and electronic systems. In an embodiment including a capacitor 400 illustrated in FIG. 4, a method may include forming a first conductive layer 402, a second conductive layer 404, and a dielectric having either a single material formed in layers, such as ZrAlON as discussed above, or interleaved layers 406, 408, 410, 412, 414 and 416 of two or more different dielectric materials, such as aluminum oxide and zirconium nitride, formed between the two conductive layers 402, 404. The conductive layers 402 and 404 may include metals, doped polysilicon, silicided metals, polycides, tantalum nitride, and/or conductive organic compounds. The sequencing and thickness of the individual dielectric layers 406, 408, 410, 412, 414 and 416 may depend on the application and may include a single layer of each material, one layer of one of the materials and multiple layers of the other, and other combinations of layers including different layer thicknesses. By selecting each layer thickness and the composition of each layer, a nanolaminate structure (comprising 308-314, or 406-416) may be engineered to have a predetermined dielectric constant, work function and composition.

In some embodiments, the total thickness of layers 408, 412 and 416 may be approximately equal to the thickness of layers 406, 410 and 414, providing about a 50% concentration of a first material (for example zirconium nitride) and a second material (for example aluminum oxide), resulting in a dielectric layer having a dielectric constant k about half way between the dielectric constant 10 of aluminum oxide and the dielectric constant 30 of zirconium nitride. Although the dielectric layers are shown in this illustrative example as being distinct layers, the oxide may be alloyed together to form a single material layer. Structures such as the nanolaminate structure 300, 400 shown in FIGS. 3 and 4 may be used in NROM (non-volatile read-only memory) flash memory devices as well as other integrated circuits. Transistors, capacitors, and other devices having dielectric films may be implemented in memory devices and electronic systems including information handling devices. Embodiments of these information handling devices include wireless systems, telecommunication systems, computers, cameras, phones, radios, displays, chip sets, set top boxes, games, vehicles, and integrated circuits.

Figure 5:
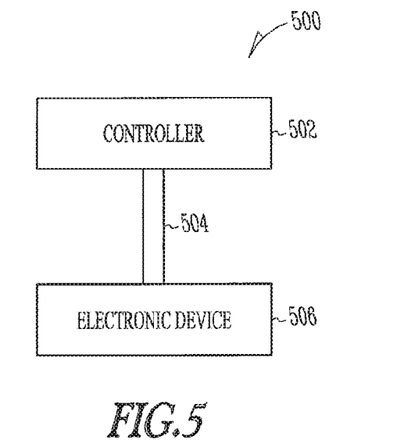
FIG. 5 is a simplified diagram of a controller coupled to an electronic device containing an atomic layer deposited dielectric layer, according to various embodiments.

FIG. 5 illustrates a diagram for an electronic system 500 having one or more devices having a dielectric layer containing an atomic layer deposited dielectric layer formed according to various embodiments. The electronic system 500 may include a controller 502, a bus 504, and an electronic device 506, where the bus 504 provides electrical conductivity between the controller 502 and the electronic device 506. Electronic devices may include a memory, a logic device, a mixed signal device, a capacitor, transistors (e.g., a bipolar transistor, a MOS transistor), a telecommunication device, a display, a set top box, or a portion of a vehicle, and other devices having a dielectric layer containing an ALD deposited dielectric layer, as described previously. In various embodiments, the controller 502 and/or electronic device 506 may include a dielectric layer containing an ALD deposited dielectric layer as previously discussed herein. Electronic system 500 may include, but are not limited to, information handling devices, wireless systems, telecommunication systems, fiber optic systems, electro-optic systems, and computers.

Figure 6:
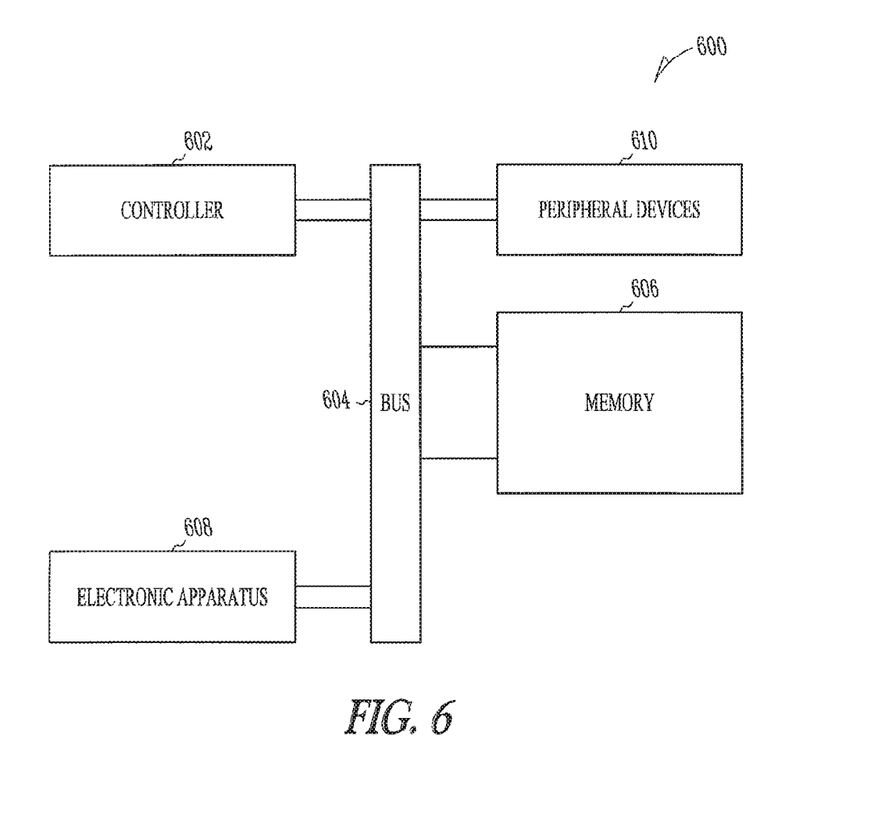
FIG. 6 illustrates a diagram of an electronic system having devices with a dielectric film formed by atomic layer deposition, according to various embodiments.

FIG. 6 depicts a diagram of an embodiment of a system 600 having a controller 602 and a memory 606. The controller 602 and/or memory 606 may include a dielectric layer having an ALD dielectric layer. The system 600 may also include an electronic apparatus 608, and a bus 604, where the bus 604 may provide electrical conductivity and data transmission between the controller 602 and the electronic apparatus 608, and between the controller 602 and the memory 606. The bus 604 may include an address bus, a data bus, and a control bus, each independently configured. The bus 604 may use common conductive lines for providing address, data, and/or control, the use of which may be regulated by the controller 602. In some embodiments, the electronic apparatus 608 may include additional memory devices configured similarly to memory 606. Some embodiments may include an additional peripheral device or devices 610 coupled to the bus 604. In some embodiments the controller 602 comprises a processor. Any of the controller 602, the bus 204, the memory 606, the electronic apparatus 608, and the peripheral devices 610 may include a dielectric layer having an ALD deposited oxide layer in accordance with the disclosed embodiments.

The System 600 may include, but is not limited to, information handling devices, telecommunication systems, and computers. Peripheral devices 610 may include displays, additional storage memory, or other control devices that may operate in conjunction with the controller 602 and/or the memory 606. It will be understood that embodiments are equally applicable to any size and type of memory circuit and are not intended to be limited to a particular type of memory device. Memory types include a DRAM (Dynamic Random Access Memory), SRAM (Static Random Access Memory) or Flash memories. Additionally, the DRAM may comprise a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies.

Forming zirconium aluminum oxynitride layers by ALD deposition may be realized using a mixture of precursors to form the ZrAlON in a single step, or by forming a laminated layer of various component members of the ZrAlON dielectric layer. The laminated layers may be annealed in a high temperature furnace or by RTA to form an essentially single layer.

There are numerous potential precursor chemicals including TMA and ZTB, and various reactant chemicals, including water vapor, that permit ALD to occur at relatively low temperatures, including at about 250° C. The ALD materials may be amorphous, providing protection from oxygen diffusion through the ZrAlON layer, and possess smooth surfaces. Such ALD dielectric films may provide enhanced electrical properties as compared to physical deposition methods, such as sputtering or typical chemical layer depositions, due to their smoother surface, and reduced process-induced surface damage, resulting in reduced leakage current.

Dielectric layers formed from zirconium nitride and aluminum oxide may have beneficial properties for gate dielectrics and capacitor dielectric materials as well, including thermal stability up to 900° C., a relatively high dielectric constant, and low leakage currents. The conductive layers contacting the dielectric may include metals, semiconductor materials, polycrystalline semiconductor materials and doped materials of either conductivity type.

Additionally, such dielectric layers may have higher dielectric constants than silicon dioxide and thus provide a significantly thicker physical thickness than a silicon oxide layer having the same electrical equivalent oxide thickness. The increased physical thickness may reduce tunneling and dielectric breakdown leakage current issues. These properties of ALD deposited dielectric layers may permit widespread application as part of the dielectric layers forming portions of electronic devices and systems.

CONCLUSION

Methods of forming an electronic device including forming a dielectric layer by using an atomic layer deposition (ALD) technique have been described. Dielectrics having zirconium nitride, $Zr_3N_4$ and aluminum oxide, $Al_2O_3$ may be formed. The different dielectric layers may be annealed to form a single layer of ZrAlON, or the ALD process may directly form ZrAlON layers. Some embodiments include forming an integrated circuit having a dielectric made by using an atomic layer deposition to form a ZrAlON layer as a gate dielectric, and a conductive layer on the dielectric to form a gate electrode. Some embodiments include a method of forming a memory array having an atomic layer deposited dielectric formed of zirconium nitride and zirconium oxide, contacting a conductive layer and forming an address decoder coupled to the memory array.

Embodiments include structures for capacitors, transistors, memory devices, and electronic systems with dielectric layers containing an atomic layer deposited ZrAlON dielectric, and methods for forming such structures. The dielectric may not have the exact formula ZrAlON, but may have various ratios of zirconium to aluminum, and of oxygen to nitrogen to obtain various dielectric constants from perhaps as low as 10, to as high as 25, or even 30, and in some embodiments, about 18, perhaps having improved oxygen diffusion barrier properties as the dielectric constant decreases. The resistance of the ZrAlON layer to crystallization may depend upon the relative amount of aluminum, and at relatively equal ratios of aluminum to zirconium may be stable up to 900° C.

The detailed description refers to the accompanying drawings that show, by way of illustration, specific aspects and embodiments in which the present invention may be practiced. These embodiments are described in sufficient detail to enable those skilled in the art to practice the embodiments. Other embodiments may be utilized, and structural, logical, and electrical changes may be made to the disclosed embodiments without departing from the scope of the present disclosure. The various embodiments are not necessarily mutually exclusive, as some embodiments can be combined with one or more other embodiments to form new embodiments.

The terms "wafer" and "substrate" used in the detailed description include any structure having an exposed surface with which to form an integrated circuit (IC) structure. The term "substrate" is understood to include semiconductor wafers. The term "substrate" is also used to refer to semiconductor structures during processing, and may include other layers that have been fabricated thereupon. Both wafers and substrates may include doped and undoped semiconductors, epitaxial semiconductor layers supported by a base semiconductor or insulator, as well as other semiconductor structures well known to one skilled in the art. The term "conductor" may include n-type and p-type semiconductors and the term "insulator" or "dielectric" is defined to include any material that is less electrically conductive than the materials referred to as conductors or as semiconductors.

The term "horizontal" as used in this document is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the various embodiments should be determined with reference to the appended claims, along with the full scope of equivalents to which such claims are entitled.

What is claimed is:

1. A method comprising:
   forming zirconium aluminum oxynitride by forming an insulating zirconium compound and an insulating aluminum compound using a monolayer by monolayer sequencing technique and processing the formed insulating zirconium compound and the formed insulating aluminum compound into zirconium aluminum oxynitride; and
   forming an electrically conductive material adjacent the zirconium aluminum oxynitride.

2. The method of claim 1, wherein forming the insulating zirconium compound includes forming $Zr_3N_4$.

3. The method of claim 1, wherein processing the formed insulating zirconium compound and the insulating aluminum compound into zirconium aluminum oxynitride includes converting the formed insulating zirconium compound and the insulating aluminum compound into zirconium aluminum oxynitride by rapid thermal annealing.

4. The method of claim 3, wherein converting by rapid thermal annealing includes depositing interleaved layers of $Zr_3N_4$ and $Al_2O_3$ and rapid thermal annealing the interleaved layers of $Zr_3N_4$ and $Al_2O_3$ to form the zirconium aluminum oxynitride.

5. The method of claim 1, wherein forming the zirconium aluminum oxynitride includes forming the zirconium aluminum oxynitride having a property, the property being a selected value of a dielectric constant, a work function, a tunneling barrier asymmetry, or an oxidation barrier.

6. The method of claim 1, wherein the method includes forming the zirconium aluminum oxynitride as part of forming a nanolaminate structure.

7. The method of claim 6, wherein forming the nanolaminate structure includes forming a nanolaminate structure in a memory device.

8. The method of claim 7, wherein forming the nanolaminate structure in the memory device includes forming a nanolaminate structure in a non-volatile read-only memory device.

9. The method of claim 1, wherein forming zirconium aluminum oxynitride includes forming a dielectric stack having an insulating zirconium nitride compound in addition to the zirconium aluminum oxynitride.

10. The method of claim 1, forming zirconium aluminum oxynitride includes forming a dielectric stack having an insulating aluminum nitride compound in addition to the zirconium aluminum oxynitride.

11. The method of claim 1, wherein the method includes forming a memory array having a dielectric including the zirconium aluminum oxynitride along with an insulating zirconium nitride and/or an insulating zirconium oxide, the dielectric contacting the electrically conductive material.

12. The method of claim 11, wherein forming the dielectric includes forming the dielectric structured as a gate dielectric of a transistor in the memory array.

13. The method of claim 1, wherein forming an electrically conductive material adjacent the dielectric layer includes forming a conductive organic compound.

14. The method of claim 1, wherein the method includes forming a transistor having a tunnel gate insulator including the zirconium aluminum oxynitride.

15. The method of claim 1, wherein the method includes forming the zirconium aluminum oxynitride on a silicon based substrate.

16. A method comprising:
   forming zirconium aluminum oxynitride by forming an insulating zirconium compound and an insulating aluminum compound using a monolayer by monolayer sequencing technique and processing the formed insulating zirconium compound and the formed insulating aluminum compound into zirconium aluminum oxynitride, wherein forming the insulating zirconium compound and the insulating aluminum compound includes forming a zirconium oxide compound and an aluminum nitride compound; and
   forming an electrically conductive material adjacent the zirconium aluminum oxynitride.

17. The method of claim 16, wherein forming the zirconium oxide compound and the aluminum nitride compound includes forming a series of interleaved layers of $ZrO_2$ and AlN.

18. The method of claim 17, wherein processing the series of interleaved layers of $ZrO_2$ and AlN includes annealing the series of interleaved layers of $ZrO_2$ and AlN to form zirconium aluminum oxynitride.

* * * * *